United States Patent
Lamy et al.

(10) Patent No.: US 9,520,366 B2
(45) Date of Patent: Dec. 13, 2016

(54) CHIP COMPRISING A PHASE CHANGE MATERIAL BASED PROTECTING DEVICE AND A METHOD OF MANUFACTURING THE SAME

(71) Applicant: Commissariat a L'Energie Atomique et aux Energies Alternatives, Paris (FR)

(72) Inventors: Yann Lamy, Saint Etienne de Crossey (FR); Luca Perniola, Noyarey (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/996,566

(22) Filed: Jan. 15, 2016

(65) Prior Publication Data
US 2016/0211230 A1    Jul. 21, 2016

(30) Foreign Application Priority Data

Jan. 15, 2015   (FR) ..................... 15 50329

(51) Int. Cl.
*H01L 23/00*   (2006.01)
*H01L 23/528*  (2006.01)
(Continued)

(52) U.S. Cl.
CPC .......... *H01L 23/573* (2013.01); *H01L 23/528* (2013.01); *H01L 23/576* (2013.01); *H01L 27/24* (2013.01); *H01L 28/40* (2013.01)

(58) Field of Classification Search
None
See application file for complete search history.

(56) References Cited

U.S. PATENT DOCUMENTS

| 6,236,103 | B1 | 5/2001 | Bernstein et al. |
| 7,384,002 | B2 * | 6/2008 | Kund ............... G06K 19/07381 235/451 |

(Continued)

OTHER PUBLICATIONS

French Preliminary Search Report issued Nov. 27, 2015 in French Application 15 50329, filed on Jan. 15, 2015 (with English Translation of Categories of Cited Documents and Written Opinion).

(Continued)

*Primary Examiner* — Benjamin Sandvik
(74) *Attorney, Agent, or Firm* — Oblon, McClelland, Maier & Neustadt, L.L.P.

(57) ABSTRACT

An electronic chip including an integrated circuit arranged a face of a substrate, and a protection device arranged partially facing the integrated circuit is provided. The protection device includes a capacitor having a first electrode and a second electrode between which a layer of phase change material is disposed changing locally from a first resistive state to a second resistive state different from the first state by penetration of a beam. The first state is an amorphous state wherein the capacitor has a first capacitance and/or a first resistance and the second state is a crystalline state wherein the capacitor has a second capacitance and/or a second resistance different from the first capacitance and first resistance. The protection device is electrically connected to the integrated circuit by at least one of the first or second electrodes so that the integrated circuit measures the resistance and/or capacitance of the capacitor.

15 Claims, 6 Drawing Sheets

(51) Int. Cl.
  *H01L 27/24* (2006.01)
  *H01L 49/02* (2006.01)

(56) References Cited

U.S. PATENT DOCUMENTS

| | | | |
|---|---|---|---|
| 7,982,488 B2* | 7/2011 | Nirschl | G11C 13/0004 326/8 |
| 8,525,169 B1 | 9/2013 | Edelstein et al. | |
| 8,816,717 B2* | 8/2014 | Fritz | H01L 23/576 257/417 |
| 8,861,728 B2* | 10/2014 | Chu | H01L 27/2436 257/E23.002 |
| 2001/0050408 A1 | 12/2001 | Bernstein et al. | |
| 2010/0026313 A1 | 2/2010 | Bartley et al. | |
| 2010/0225989 A1 | 9/2010 | Anders | |
| 2010/0279053 A1 | 11/2010 | Tsuchino et al. | |
| 2013/0306929 A1 | 11/2013 | Lee et al. | |
| 2014/0376149 A1 | 12/2014 | Lamorey | |
| 2015/0108606 A1 | 4/2015 | Lamy et al. | |

OTHER PUBLICATIONS

Semyon D. Savransky "A New Application of Phase-Change Alloys", E/PCOS, 2014, 2 pages.

* cited by examiner

CHIP COMPRISING A PHASE CHANGE MATERIAL BASED PROTECTING DEVICE AND A METHOD OF MANUFACTURING THE SAME

TECHNICAL FIELD

The present invention relates to an electronic chip provided with a phase-change material protective device, a method for detecting an attack on the chip and a method for manufacturing said chip.

The invention will find its application in the field of security and the protection of electronic chips. The invention applies to any type of electronic chip: cell telephony chip, bank card, health card, microprocessor, interposer (for example computing unit), microcontroller, etc.

STATE OF THE ART

The purpose of attacks that an electronic chip may suffer is to access confidential data stored in the electronic chip, in particular to clone it, or to modify the information stored.

Electronic chips may be attacked in various ways: chemical, physical, laser, electromagnetic, electrical, etc.

In carrying out these attacks, two objectives are generally followed. The first consists of acquiring or finding internal information manipulated by the integrated circuit of the chip (observation of the electrical consumption of the circuit or of the electromagnetic radiation produced by the circuit, probing of the circuit, that is to say physically accessing the circuit by establishing an electrical connection with an internal track of the circuit, contactless probing of an internal track, etc. The second consists of injecting faults (change in state of a bit or of a group of bits via an injection of light, laser, electromagnetic radiation, etc.) during a computation carried out by the integrated circuit of the chip. Very often, a combination of these various techniques is used.

In order to guard against such attacks, several types of protection exist. The first protection level is the hardware physical protection of the chips. The front face of an electronic chip (the face at which conventionally the integrated circuit of the chip is situated) can for example be protected by adding particular protection layers on this front face.

There also exist protections for the rear face of the electronic chip. This is because the rear face of the chip is a sensitive zone that can be attacked with current etching and thinning techniques making it possible to approach to within a very short distance from the integrated circuit of the chip in order to recover information stored or to inject faults into the chip.

Moreover, in order to be effective, it is necessary to be able to control the whole of the protection device and to detect an attack.

However, the solutions proposed at the present time do not make it possible both to provide effective protection without risk of impairment or elimination of the protection device and to reliably detect the whole of said protection.

There therefore exists the need to propose an electronic chip the integrated circuit of which is effectively protected and for the largest number of attacks to be detected reliably.

SUMMARY OF THE INVENTION

For this purpose the present invention proposes an electronic chip comprising an integrated circuit disposed on either the front face or the rear face of a substrate and a protection device arranged at least partially facing the integrated circuit. The protection device comprises at least one capacitor comprising a first electrode and a second electrode and at least one layer of phase-change material interposed between said two electrodes. The at least one layer of phase-change material is configured so as to at least locally change from a first resistive state to a second resistive state different from the first state by penetration of a photon and/or ion beam. The first resistive state is chosen from an amorphous state in which the capacitor has a first resistance and/or a first capacitance and a crystalline state in which the capacitor has a second resistance and/or a second capacitance. The second resistance and the second capacitance are respectively different from the first capacitance and the first resistance. The protection device is electrically connected to the integrated circuit so that the integrated circuit detects the resistance or capacitance of the capacitor. This detection thus makes it possible to identify a change in state of the at least one layer of PCM and therefore to detect an attack on the electronic chip.

The invention makes it possible to combine a reliable protection of the integrated circuit by a protective stack comprising a plurality of layers and reliable detection of any attack by the change in state of phase-change material contained in a capacitor.

Phase-change materials are materials in which a resistive transition can be observed. The phase-change material is configured so as to adopt alternately a strongly resistive state, also referred to as a high resistive state (HRS), and a weakly resistive state, also referred to as a low resistive state (LRS). The phase-change material is said to be in a high resistive state HRS when its resistance is greater than that of the material in a low resistive state LRS. Conventionally, an amorphous state is an HRS and a crystalline state is an LRS.

A phase-change material and the two electrodes in which the phase-change material is interposed form a capacitor, the capacitive and resistive properties of which vary according to the state of the phase-change material. The presence of a capacitor arranged at least partially facing the integrated circuit, advantageously on one of the faces of the electronic chip, offers physical protection of the chip by increasing the thickness in order to access the integrated circuit, whether by its front face or by its rear phase. Moreover, a capacitor according to the invention comprising a layer of phase-change material provides protection against laser attacks. This is because an ion and/or photon beam will act on the phase-change material and advantageously cause it to change state, causing it to change from an HRS to an LRS. This change in state is detected by the integrated circuit to which the protection device is connected. Preferentially, this detection causes the integrated circuit to fail.

According to a preferred embodiment, the protection device is disposed on a face opposite to the integrated circuit, preferentially the rear face, the sensitive face of the electronic chip.

It is advantageous for the capacitor to comprise at least three layers of stacked phase-change materials. This is because, under the effect of a photon and/or ion beam, the heat received by the internal layer will be confined by means of the other two external layers situated on either side of the internal layer. This confinement of the heat allows a rapid increase of the temperature in the internal layer of phase-change material, thus assisting a rapid change in state. The presence of three stacked layers makes it possible to maintain at least one layer of phase-change material in an HRS that is confined, providing finer detection of an attack by photon and/or ion beam.

According to an advantageous embodiment, at least one layer from the three layers is in an amorphous state and at least one other layer from the three layers is in a crystalline state. Preferably, at least one amorphous layer is an internal layer, that is to say a layer interposed between two other layers, preferably amorphous or crystalline. This embodiment makes the temperature rise even more rapid.

BRIEF DESCRIPTION OF THE FIGURES

The aims, objects, features and advantages of the invention will emerge more clearly from the detailed description of an embodiment thereof that is illustrated by the accompanying figures, in which.

The accompanying drawings are given by way of examples and are not limitative of the invention. They constitute outline schematic representations intended to facilitate understanding of the invention and are not necessarily to the scale of practical applications.

In particular, the relative thicknesses of the various layers and films do not represent reality.

DETAILED DESCRIPTION OF THE INVENTION

Before beginning a detailed review of embodiments of the invention, it is first of all stated that the invention relates, according to a first aspect, to an electronic chip comprising an integrated circuit arranged on either the front face or the rear face of a substrate and a protection device arranged at least partially facing the integrated circuit, characterized in that the protection device comprises at least one capacitor comprising a first electrode and a second electrode between which at least one layer of phase change material is disposed, configured so as to change at least locally from a first resistive state to a second resistive state different from the first state by penetration of a photon and/or ion beam, the first state being an amorphous state in which the capacitor has a first capacitance and/or a first resistance and the second state being a crystalline state in which the capacitor has a second capacitance and/or a second resistance respectively different from the first capacitance and first resistance, the protection device being electrically connected to the integrated circuit by at least one of said first or second electrodes so that the integrated circuit measures the resistance and/or capacitance of the capacitor.

According to another aspect, the invention relates to an electronic chip comprising an integrated circuit arranged on a substrate and a protection device arranged at least partially facing the integrated circuit, the protection device comprising at least one capacitor comprising:
a first electrode,
a second electrode,
and at least three stacked layers of phase-change materials, defining at least two external layers and at least one internal layer interposed between said at least two external layers,
in that said at least three stacked layers of phase-change materials are disposed at least partially between the two electrodes, in that at least a first layer from said at least two external layers and said at least one internal layer is in an amorphous state and is configured so as to at least locally change from said amorphous state in which the capacitor has a first capacitance and/or a first resistance and to a crystalline state in which the capacitor has a second capacitance and/or a second resistance respectively different from the first capacitance and the first resistance, and in that at least a second layer from said at least two external layers and said at least one internal layer is in a crystalline state, the protection device being electrically connected to the integrated circuit by at least one of said first or second electrodes so that the integrated circuit measures the resistance and/or capacitance of the capacitor.

Optional features, which may optionally be used in association or alternatively, are stated below:
the second resistance of the capacitor is less than the first resistance;
the integrated circuit is arranged on a first face from among a front face or a rear face of the substrate and in which the protection device is arranged on a second face of the substrate, different from the first face on which the integrated circuit is arranged and chosen from the front face or rear face of the substrate;
each of the first and second electrodes respectively and entirely covers one of the two external layers;
the first and second electrodes respectively and at least partially cover an external layer that is associated with it and at least one from among the first and second electrodes cover only part of the external layer that is associated with it;
at least one internal layer is said first layer in an amorphous state and at least one of said two external layers is said second layer in a crystalline state. The chip comprises an internal layer forming said first layer in an amorphous state and two external layers in a crystalline state;
the protection device comprises at least three stacked layers of phase-change materials defining two external layers and at least one internal layer;
the two external layers are in a crystalline state and the at least one internal layer is in an amorphous state;

the crystallization temperature of the at least one internal layer of phase-change material is higher than the crystallization temperatures of the external layers of phase-change material;

the external layers of phase-change material have a thickness of between 50 nm and 200 nm;

the at least one internal layer of phase-change material has a thickness of preferably between 5 and 30 nm;

the protection circuit is electrically connected to the integrated circuit by a buried interconnection;

the integrated circuit is arranged on either a front face or a rear face of the substrate and in which the protection device extends over a surface area of the substrate at least equivalent to the surface area over which the integrated circuit extends;

the at least one capacitor comprises at least one trench formed in the thickness of the substrate;

the trench has a width preferably of between 500 nm and 1 μm;

the protection device comprises a plurality of capacitors connected in series.

According to another aspect, the invention also concerns a method for detecting an attack by an ion and/or photon beam on the electronic chip as described above, characterized in that it comprises the following steps performed by the integrated circuit:

identification of the so-called initial capacitance and/or resistance of the protection device;

subsequent measurement of the subsequent capacitance and/or resistance of the protection device;

comparison of the subsequent capacitance and/or resistance of the initial capacitance and/or resistance, identical values indicating the absence of an attack on the electronic chip, different values indicating the existence of an attack on the electronic chip that led to the change in the state of at least one layer of state-change material.

Advantageously, the initial capacitance and/or initial resistance is identified by measuring the initial capacitance and/or initial resistance of the protection device.

According to another aspect, the invention relates to a method for manufacturing an electronic chip as described above, characterized in that it comprises at least the following steps of:

formation of an integrated circuit at one face of a substrate chosen from the front face or the rear face;

formation of at least one capacitor at least partially facing the integrated circuit, comprising the deposition of a first electrode and the deposition of at least one layer of phase-change material configured so as to change at least locally from a first state to a second state different from the first state by penetration of a photon and/or ion beam, the first state being an amorphous state in which the capacitor has a first capacitance and/or a first resistance and a second state being a crystallized state in which the capacitor has a second capacitance and/or a second resistance respectively different from the first capacitance and the first resistance, and the deposition of a second electrode;

electrical connection of the protection circuit to the integrated circuit.

According to another aspect, the invention also relates to a method for detecting an attack by an ion and/or photon beam on the electronic chip as described above, characterized in that it comprises the following steps of:

formation of an integrated circuit at a face of a substrate chosen from the front face or the rear face;

formation of at least one capacitor at least partially facing the integrated circuit, comprising the deposition of a first electrode, the formation of at least a first external layer made from phase-change material, situated at least partially facing the first electrode, the formation of at least one internal layer of phase-change material, configured so as to at least locally change from an amorphous state to a crystalline state by penetration of a photon and/or ion beam, the capacitor having in the amorphous state of the at least one internal layer a first capacitance and/or a first resistance and the capacitor having in the crystalline state of the at least one internal layer a second capacitance and/or a second resistance respectively different from the first capacitance and first resistance, the formation of at least a second external layer of phase-change material, at least one of said first and second external layers being in a crystalline state;

and the deposition of a second electrode at least partially facing the second external layer;

electrical connection of the protection circuit to the integrated circuit.

Advantageously, the step of forming the at least one first electrode or the step of forming the at least one second electrode comprises the deposition of a layer of phase-change material in an amorphous state and next comprises.

Advantageously, the deposition of at least one layer of phase-change material comprises the deposition of at least three layers of stacked phase-change material defining at least two external layers and at least one internal layer.

Advantageously, the steps subsequent to the deposition of the at least one internal layer are configured so as to maintain the first state of the at least one internal layer of phase-change material.

Advantageously, the manufacturing method comprises a step subsequent to the deposition of at least one internal layer configured so as to make the phase-change material of at least one of the two external layers change from a first state to a second state different from the first state.

Advantageously, the manufacturing method comprises configured so as to make the phase-change material of at least one of the two external layers change from the amorphous state to a crystalline state.

In the context of the present invention, the term "on", "surmounts" or "underlying" or their equivalents does not necessarily mean "in contact with". Thus, for example, the deposition of a first layer on a second layer does not necessarily mean that the two layers are directly in contact with each other but means that the first layer at least partially covers the second layer while being either directly in contact therewith or while being separated from it by another layer or another element.

It is established that the electrical capacitance of a capacitor is determined essentially according to the shape of the electrodes and the nature of the insulator or insulators; the following simplified formula is often used to estimate its value:

$$C = \varepsilon \frac{S}{e} \qquad \text{Formula I}$$

with S: the surface area of the facing electrodes, e: the distance between the electrodes and ∈ the permittivity of the dielectric.

In the context of the present invention, the dielectric is the phase-change material (PCM), the resistance of which depends on its state.

The electronic chip according to the invention comprises a substrate 2 on which, preferentially on its front face 4, an electronic circuit, preferentially an integrated circuit 1, is disposed. The integrated circuit 1 may be of various kinds, for example a complementary metal oxide semiconductor may be used. The substrate 2 may comprise a plurality of integrated circuits 1 protected or not by a single or a plurality of protection devices 3 described below.

Figure 2:
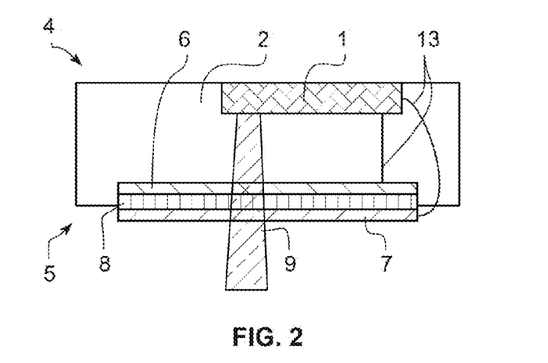
FIG. 2: schematic view of an electronic chip according to the invention comprising an integrated circuit on the front face and a protection device on the rear face subjected to a laser attack.

According to the invention, the electronic chip comprises a protection device 3 arranged at least partially facing the integrated circuit 1, advantageously on one of the front or rear faces of the substrate 2. In the case of an arrangement on the front face, the protection device may be formed directly above the integrated circuit 1. The protection device may also be buried in the substrate, or be formed on another substrate arranged at least partially facing the integrated circuit 1, such as for example a protective cover for the integrated circuit 1. The protection device 3 is disposed at least partially facing the integrated circuit 1 and, advantageously in order to provide optimum protection, the protection device 3 extends over a surface area of the substrate 2 greater than the surface area of the integrated circuit 1 as illustrated in FIG. 2.

According to a preferred embodiment, the protection device 3 is placed on the face of the substrate 2 opposite to the face receiving the integrated circuit 1. Preferentially, the protection device 3 is on the rear face 5 and the integrated circuit 1 is on the front face 4 of the substrate 2.

The protection device 3 comprises a capacitor. The capacitor comprises a first electrode 6, also referred to as the top electrode, and a second electrode 7, also referred to as the bottom electrode. The capacitor comprises, between the first electrode 6 and the second electrode 7, at least one layer of PCM 8. The capacitor is a stack of layers comprising at least two electrodes 6, 7 and at least one interposed layer of PCM 8.

The protection device 3 is electrically connected to the integrated circuit 1, preferentially by at least one of two electrodes 6, 7. According to one possibility, the protection device 3 is connected by an electrode 6, 7 to the integrated circuit 1 and is connected to a reference earth by the other one of said electrodes 6, 7. This earth may be external to the integrated circuit 1. According to another preferred possibility, the two electrodes 6, 7 are electrically connected to the integrated circuit 1.

In the case where the protection device 3 is arranged on the same face as the integrated circuit 1, the electrical connections are connections that are standard in microelectronics, composed of horizontal conductive lines (e.g. copper) and vertical connections (vias). In the case where the protection device 3 is arranged on a face opposite to the integrated circuit 1, the electrical connections are vertical interconnections, also referred to as buried through the substrate 2, for example by trenches through the silicon (through silicon vias—TVS).

The electrical connection of the capacitor directly to the integrated circuit 1 enables the capacitance and/or resistance of the capacitor to be measured, and thereby allows detection of an attack by ion and/or photon beam 9. By virtue of the invention, the integrated circuit 1 advantageously continuously measures the capacitance and/or resistance of the capacitor, which means that the control of the state of the PCM is continuous and therefore the detection of an attack is permanent.

The remainder of the description is given for a capacitor of the protection device 3. The protection device may comprise a plurality of capacitors such as the one described below and illustrated in FIG. 5.

The capacitor according to the invention comprises at least one layer of PCM 8. The PCM 8 is preferentially in a first state before any attack by photon and/or ion beam. The penetration of the photon and/or ion beam 9 through the at least one layer of PCM 8 causes the change in state of said PCM 8 to a second state. The first state and the second state are different states and, advantageously, the first state and the second state have different resistances. The different resistance of the PCM 8 between the first state and the second state also implies a different capacitance and/or resistance of the capacitor according to the state of the PCM 8.

The first state and the second state are chosen from a strongly resistive state, also referred to as a high resistive state (HRS), and a weakly resistive state, also referred to as a low resistive state (LRS). The phase-change material is said to be in a high resistive state, HRS, when its resistance is higher than that of the material in a low resistive state LRS. Preferentially, the high resistive state or HRS is also referred to as the amorphous state and the low resistive state or LRS is also referred to as the crystalline state.

According to a preferred embodiment, the first state of the at least one layer of PCM 8 is a high resistive state HRS, an amorphous state in which the capacitor has a first capacitance and/or a first resistance, and the second state is a low resistive state LRS, a crystalline state, in which the capacitor has a second capacitance and/or a second resistance. In this way, the change in state of the PCM 8 involves a change in resistance and/or capacitance of the capacitor that is detected by the integrated circuit 1. Advantageously, the second resistance of the capacitor is lower than the first resistance of the capacitor. The first capacitance of the capacitor is constant for the first state of the at least one layer of PCM 8. The second capacitance of the capacitor is variable for the second state of the at least one layer of PCM 8, in particular according to the partial or total change in state of the at least one layer of PCM 8 and the number of layers of PCM 8. The second capacitance may be less than or greater than the first capacitance.

The integrated circuit 1 electrically connected to the capacitor can monitor a change in capacitance and/or resistance of said capacitor.

The penetration of the ion and/or photon beam 9 in the at least one layer of PCM 8 causes an at least local increase in the temperature. It is this increase in temperature that will trigger the change from the first state to the second state of the PCM.

Figure 3:
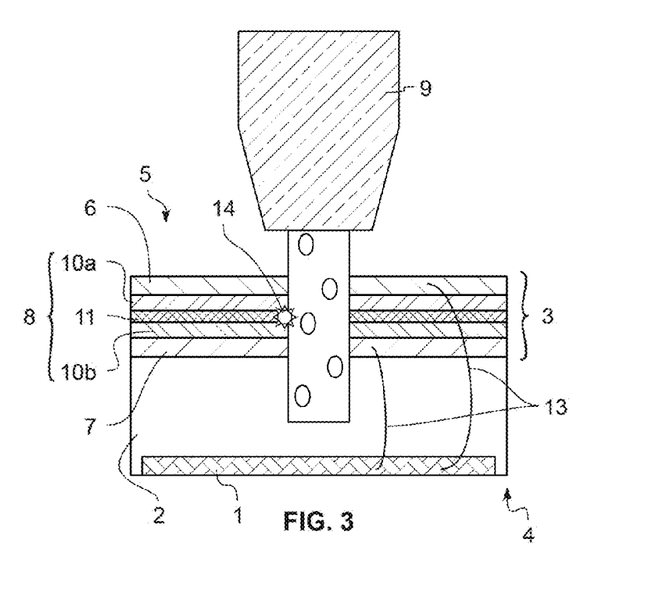
FIG. 3: schematic view of an electronic chip according to the invention comprising an integrated circuit on the front face and a protection device on the rear face subjected to an attack by focused ion beam (FIB).

Photon and/or ion beam 9 means a laser beam or ion beam referred to as an FIB (focus ion beam). The photon beams of the laser type conventionally used for attacking electronic chips have a wavelength of 40 nm to 1500 nm. Attack by ion beam, FIB, although being considered to be an attack destroying the electronic chip, may be extremely localized with holes of a few microns. This localized destruction causes only a small modification to the electronic chip that cannot be identified easily. However, the protection device 3 according to the invention is also sensitive to this type of attack, which generates heating 14 at the destruction zone, as illustrated in FIG. 3. This localized heating 14 causes a change in state of the PCM layer 8 of the capacitor of the protection device 3. The change to the crystallized state of at least one layer of PCM 8, locally at the walls of the destruction zone, causes a change in the capacitance and/or resistance of the capacitor that is detected by the integrated circuit 1.

The change from the first state to the second state of the PCM may be only local in the layer of PCM 8. That is to say it is not necessary for the whole of the layer of PCM 8 to change from the first state to the second state. Advantageously, a local change is sufficient to involve a change in the resistance of the PCM and therefore of the capacitance and/or resistance of the capacitor that is detected by the integrated circuit 1.

Advantageously, the capacitor comprises at least three layers of PCM stacked between the two electrodes 6, 7. Preferentially and non-limitatively, the capacitor comprises three layers of PCM stacked between the two electrodes 6, 7. This arrangement makes it possible to offer a protection device 3 that is more sensitive to the photon and/or ion beam 9. The stack defines two external layers of PCM 10a, 10b. Between the two external layers 10a, 10b, the stack comprises at least one internal layer 11 of PCM. According to the non-limitative embodiment illustrated in the figures, the stack comprises a single internal layer 11. This facilitates production and reduces the cost of the chip. The two external layers 10a, 10b have an action of concentrating heat during the attack by ion and/or photon beam 9, very significantly promoting the rise in temperature in the internal layer 11. The change from the first state to the second state is therefore accelerated for the internal layer, allowing detection even in the case of an attack of short duration. In order to obtain a detection of an attack by ion and/or photon beam 9 that is optimum, it is preferred for the capacitor to comprise a plurality of layers of PCM. The stack of three layers of PCM is a favored embodiment.

In an alternative embodiment of the invention, the protection device 3 comprises a stack of more than three layers. In this embodiment, the protection device 3 comprises at least one internal layer 11 in a state different from the external layers 10a, 10b. Internal 11 means a layer lying between at least two other layers. These other two layers may advantageously be external layers 10a, 10b in contact with an electrode 6, 7. In a non-limitative example comprising five layers, there are two external layers 10a and 10b delimiting the top and bottom surfaces of the stack, and three layers lying between these external layers 10a, 10b. These three layers are internal layers 11. They do in fact all lie between two other layers (either between one of the external layers 10a or 10b and another internal layer 11, or between two internal layers 11). The external layers 10a, 10b are advantageously in contact respectively with the first electrode 6 and the second electrode 7.

Particularly advantageously and as will be detailed below, at least one of the external 10a, 10b or internal 11 layers is in an amorphous state and at least one other of these layers is in a crystalline state. Preferably, the at least one of the internal layers 11 is amorphous. According to a particularly advantageous embodiment, the or at least one of the internal layers 11 is amorphous and the two external layers 10a, 10b are crystalline. This makes it possible to confine the temperature-rise zone and to detect an attack particularly rapidly and finely.

Preferably, the crystalline layers are formed by the deposition of an amorphous layer and then by an operation of crystallization of this layer.

Each external layer 10a, 10b is in contact with one of the two electrodes 6, 7 through an external face of the external layer 10a, 10b turned opposite this electrode.

According to one embodiment, the surface area of contact between the external layer 10a, 10b and the electrode 6, 7 that is associated with it is equal to the surface area of the external face of this external layer 10a, 10b. In other words the electrode 6, 7 entirely covers the external layer 10a, 10b.

Figure 9:
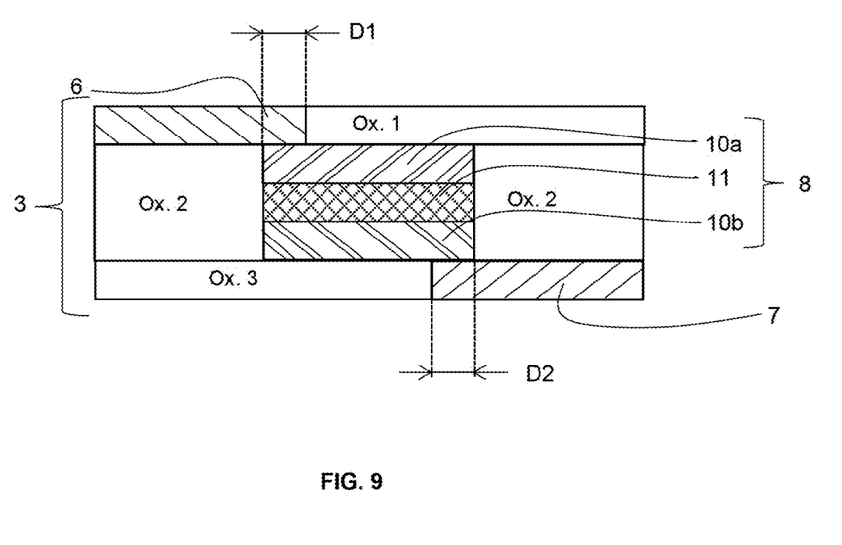
FIG. 9: architecture of a capacitor according to another embodiment of the invention.

According to one embodiment, the electrode 6, 7 covers only part of the external layer 10a, 10b. Thus the surface area of contact between the external layer 10a, 10b and the electrode 6, 7 that is associated therewith is less than the surface area of the external face of this external layer 10a, 10b. This embodiment is illustrated in FIG. 9. In this example the electrodes 6 are in contact with the external layers 10a, 10b only over a distance D1 and D2, taken in a dimension (horizontal in FIG. 9) corresponding to only a portion of the external layers 10a, 10b taken in this same dimension. By way of example, D1 and D2 may be between 1 and 100 nm. A larger contact portion can also be envisaged.

Thus, in one embodiment of the invention, the electrodes 6, 7 are advantageously offset with respect to the layer or layers of PCM. In this case the electrode elements positioned are advantageously connected electrically in series.

This offset in superimposition between electrodes 6, 7 and layers of PCM 10a, 10b, 11 affords better sensitivity to attacks for a capacitor with at least three layers of PCM 8 by virtue of the distancing of the thermal drains formed by the metal electrodes. The capacity for detection of an attack by the device is thus increased. Another advantage of this specific architecture is a reduction in stresses and a reduction in the flexing (warping/bowing) of the stack. In particular the combination, within the same stack, of conductive layers forming the electrodes and layers of PCM causes stresses and a certain flexing. Reducing the surface area of the electrodes reduces these phenomena.

Advantageously, the internal layer 11 is in a first amorphous state HRS. This internal layer 11 is therefore buried in the stack of layers of PCM 8. The two external layers 10a, 10b, are preferentially in a second crystalline state LRS. In an alternative embodiment, at least one of the external layers 10a, 10b is in a crystalline state. In this way, these two external layers 10a, 10b fulfill the role of buffer faced with the dissipation of heat out of the internal layer 11. The two external layers 10a, 10b in their crystalline state fulfill a role of thermal insulator of the internal layer 11, without limiting the threshold of detection of the attack by ion or photon beam 9. The heat received by the internal layer 11 during the attack is maintained therein.

In an embodiment comprising a plurality of internal layers 11 (an embodiment comprising more than three PCM layers 8), at least one of the internal layers 11 is in an amorphous state. The other internal layers 11 may advantageously be in an amorphous or crystalline state. In an advantageous embodiment of the invention, a single internal layer 11 is present between two external layers 10a, 10b. In this configuration the internal layer 11 is in an amorphous state and the external layers 10a, 10b in a crystalline state.

According to a preferred embodiment, the internal layer 11, or the at least one layer of PCM 8 in the case of a single layer of PCM 8 in the capacitor, is in a first state referred to as the original state. Preferentially, the first state is the amorphous state HRS. Original means the state obtained at the end of the step of deposition of said layer and before any other subsequent step of manufacture or programming or change of state. In the original state, the capacitance and/or resistance is said to be initial.

In the case of the stacking of three layers of PCM, it is preferred for the crystallization temperature of the PCM of the internal layer 11 to be higher than the crystallization temperature of the PCM or PCMs of the external layers 10a, 10b.

Worded differently, it is preferred for the thermal budget of the steps of manufacture of the electronic chip subsequent to the step of deposition of the internal layer 11 to be less than the crystallization temperature of the PCM of the internal layer 11.

The internal layer 11 preferentially has a thickness of between 5 and 30 nm, preferentially 10 nm.

The thickness of the internal layer 11 is defined so as to be sufficiently thick to provide electrical insulation in its amorphous state and sufficiently fine to allow the formation of a conductive track when changing to a crystalline state.

The external layers 10a, 10b have a sufficient thickness to prevent rapid cooling of the internal layer 11 in contact that may cause unexpected changes in state of the PCM from a crystalline state to an amorphous state. For example, a thickness of less than or equal to 200 nm is preferred. Moreover, the thickness of the internal layers 10a, 10b must be sufficient to fulfill the role of thermal insulator between the internal layer 11 and the electrodes 6, 7. For example, the thickness is greater than or equal to 50 nm.

The PCM that can be used to form the at least one layer of PCM 8 is GST: $Ge_xSb_yTe$. This type of PCM is particularly sensitive to the heating generated by an ion and/or photon beam. It can easily be deposited by vapor deposition (PVD, standing for physical vapor deposition) or by plasma enhanced chemical vapor deposition (PECVD) at various temperatures, which is very useful for the manufacturing method of the invention described below.

To adjust the thermal conductivity Kth, the specific heat volume Cv or the crystallization temperature, dopants may be introduced into the PCM, such as oxygen, nitrogen, indium or cerium. The doping of the PCM influences in particular the crystallization temperature. For example, the crystallization temperature of GeTe doped with carbon varies from 170° C. at 0% carbon to more than 400° C. at 24% carbon. In the case of GST doped with carbon the crystallization temperature varies from 150° C. at 0% carbon to more than 340° C. at 24% carbon. In the case of GeTe doped with nitrogen, the crystallization temperature varies from 170° C. at 0% nitrogen to more than 270° C. at 10% nitrogen. These variations in crystallization temperature are not followed by the same variations in the melting point. For example, GeTe and GeTe doped with 10% nitrogen have substantially the same melting point at around 715° C.

The invention relates, according to one aspect, to a method for manufacturing an electronic chip as described, or more precisely the method for manufacturing the protection device on an electronic chip provided on one face with at least one integrated circuit 1. On a substrate at least one integrated circuit 1 is first of all formed.

The method comprises the following steps:

Deposition, for example by vapor deposition (PVD, standing for physical vapor deposition) of the first electrode 6, for example made from aluminum, a transparent electrode made from indium tin oxide (ITO).

Deposition of at least one layer of PCM 8, for example the successive deposition of three layers, including two external 10a, 10b, and one internal, 11, for example by vapor deposition (PVD, standing for physical vapor deposition) or by plasma enhanced chemical vapor deposition (PECVD). Advantageously, a first external layer 10a is first deposited, at least partially in contact with the first electrode 6. Next the internal layer 11 is deposited, and finally the second external layer 10b is deposited. In one embodiment of the invention, the external layer 10a is deposited so as to be completely in contact with the first electrode 6.

Deposition of the first electrode 7, at least partially in contact with the external layer 10b, for example made from aluminum, a transparent electrode made from indium tin oxide (ITO), for example by vapor deposition (PVD, standing for physical vapor deposition), or by plasma-enhanced chemical vapor deposition (PECVD).

In an alternative embodiment of the invention, the second electrode 7 is deposited first, and then come the external layer 10b, the internal layer 11, the external layer 10a and finally the first electrode 6. As in the first embodiment, the contact between the electrodes 6, 7 and the external layers 10a, 10b may be partial or total.

By way of example, the first electrode 6 and the second electrode 7 are made from aluminum with a respective thickness of 50 nm, and the internal layer 11 has a thickness of 10 nm.

The step of depositing the first electrode 6 is performed at a temperature below the crystallization temperature of the at least one layer of PCM 8, or more precisely lower than the crystallization temperature of the PCM of the internal layer 11.

According to one embodiment, the method comprises an annealing step after the deposition of the at least three layers of PCM 10a, 10b, 11. This annealing step is carried out at a temperature above the crystallization temperature of the PCM or PCMs of the external layers 10a, 10b but at a temperature below the crystallization temperature of the PCM of the internal layer 11. In this way, the external layers 10a, 10b will be in a crystallization state while the internal layer 11 will remain in an original state, preferentially an amorphous state.

It is advantageous for the properties of the protection device and more specifically of the capacitor to be optimized in order to obtain a probability of detection of any attack by ion and/or photon beam 9 that is as high as possible.

The non-exhaustive parameters involved in the optimization of the capacitor are firstly the parameters of the materials of each layer in the stack forming the capacitor including the electrodes 6, 7: for example the refractive index n, the absorption index k, the thermal conductivity Kth, the specific heat volume Cv, and the thickness t. The values of these parameters are intrinsic to the materials chosen and are known for each one in the literature, and secondly the properties of the photon and/or ion beam 9 used for attacking the electronic chip: wavelength λ, power Pw, dimension of the beam at the point of contact d, the duration of the laser pulse $t_{pulse}$, and the time between each pulse $t_{idle}$.

From such information, the absorbance of the layers of PCM can be maximized and consequently also the thermal profile in the capacitor during the laser firing. In order to ensure that a crystalline percolation path is created in the internal layer 11 of PCM, the temperature must rise locally above the crystallization temperature of the internal layer 11 of PCM, so that crystallization is triggered.

EXAMPLE

Figure 1:
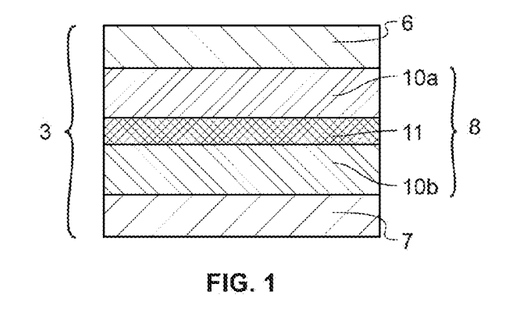
FIG. 1: architecture of a capacitor according to one embodiment for a protection device according to the invention.

An example of quantitative optimization of the capacitor illustrated in FIG. 1 is implemented as follows. In the following microscopic parameters (when they are not defined elsewhere) are those of the GST (alloy of germanium, antimony and tellurium in a proportion 225, Ge2Sb2Te5). The external layers of PCM 10a, 10b are composed of standard GST having a crystallization temperature Tc of around 150° C., making it possible to find them in the crystalline state at the end of the manufacturing process. The internal layer of PCM is composed of a carbon version doped with GST, or more precisely GST-C15%, which makes it possible to increase the crystallization temperature Tc~150° C. of the GST to Tc~325° C. for the GST-C15%, without substantially modifying the other parameters such as the refractive index n (=3.8) and the absorption index k (=3.4), in order to ensure its amorphous integrity at the end of the manufacturing process. The thermal conductivity Kth and the specific heat volume Cv are identical for the PCM of the internal 11 and external 10a, 10b layers in the amorphous state and in the crystalline state (Kth=0.3 W/m*K; Cv=1.3e6 J/m$^3$*K).

Figure 6:
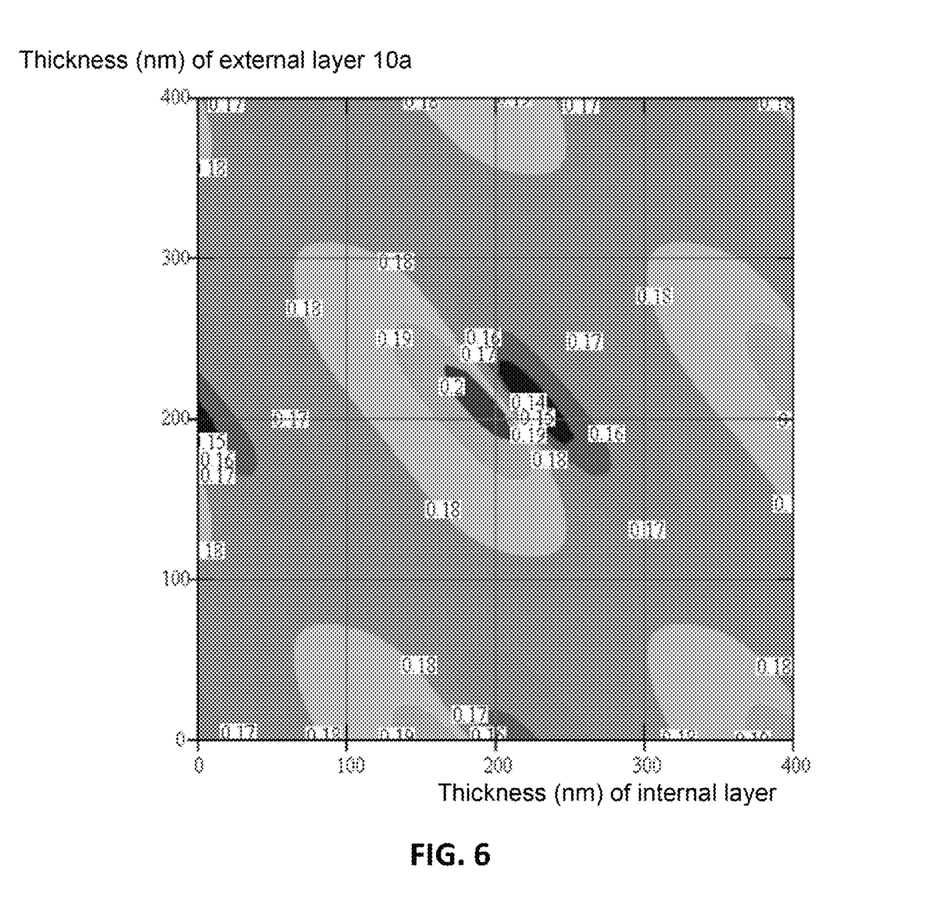
FIG. 6: mapping of the absorption coefficient of the photon radiation of the stack of a capacitor of the protection device according to the thickness of the external layers of phase-change material.

The steps for optimizing the stack are described below:

1. Maximizing the absorption of the stack in order to convert any attack by ion and/or photon beam 9 as quickly as possible into thermal heating, in order to cause the crystallization of the at least one layer of PCM 8, or more precisely of the internal layer 11 of PCM. From n, k, Ke, λ=1000 nm (the wavelength generally used for the attacks), calculating the dimensions of the external layers 10a, 10b, in particular the thickness, in order to have maximum absorbance. In FIG. 6, a local maximum is obtained for $t_{external\ layer\ 10a}$=200 nm and $t_{external\ layer\ 10b}$ 200 nm ($t_{internal\ layer\ 11}$=10 nm is constant). These are not the only possibilities since, from the map in FIG. 6, other maxima that can also be used are deduced, for example $t_{external\ layer\ 10a}$=400 nm and $t_{external\ layer\ 10b}$=200 nm ($t_{internal\ layer\ 11}$=10 nm is constant). It is preferable to avoid the maxima that record t=0 nm for the other layer, which would imply poor thermal insulation vis-à-vis the electrodes 6, 7 and therefore a reduction in the reliability of the detection of the attacks.

Figure 7:
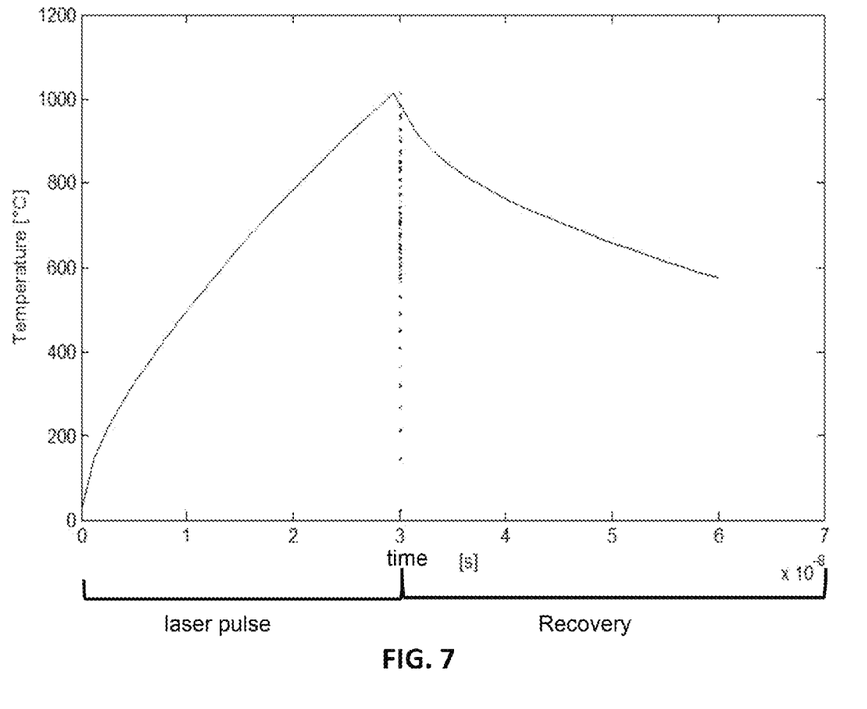
FIG. 7: change in the maximum temperature in the stack as a function of time during a 30 ns laser pulse and during the following 30 ns.
Figure 8:
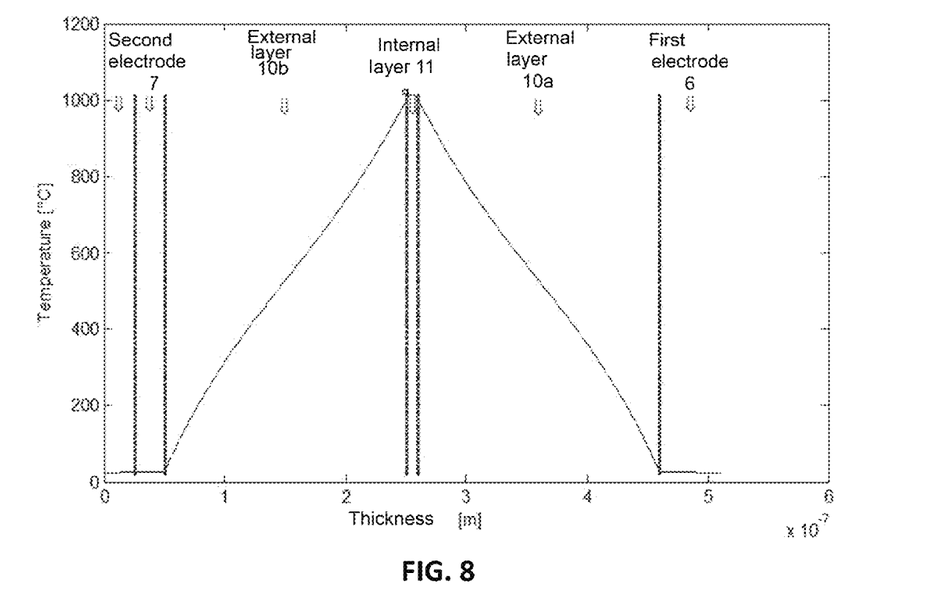
FIG. 8: temperature profile in the thickness of the capacitor at the end of a laser irradiation of 30 ns, that is to say exactly at t=30 ns.

2. Calculating the distribution of the temperature in the stack with all the parameters concerning the materials and the laser with d=2 pm, Pw=250 mW, $T_{pulse}$=30 ns, $T_{idle}$=30 ns, the graphs in FIGS. 7 and 8 are obtained. In order to be sure that the laser attack is detected, the internal layer 11 in the amorphous state must crystallize. It is therefore necessary for the temperature in the internal layer 11 to be higher than the crystallization temperature of the PCM of this layer. If for example Tc-$_{internal\ layer\ 11}$~400° C., the crystallization begins after 10 ns of laser pulse. We note moreover that it is impossible to have a spurious crystalline to amorphous transition in said internal layer 11 during intermediate phases (denoted "recovery" in FIG. 7) between the laser pulses, since the cooling rate of the PCM is very slow compared with the rate necessary for the transition to the amorphous state, normally higher than 1e10 K/sec).

Figure 4:
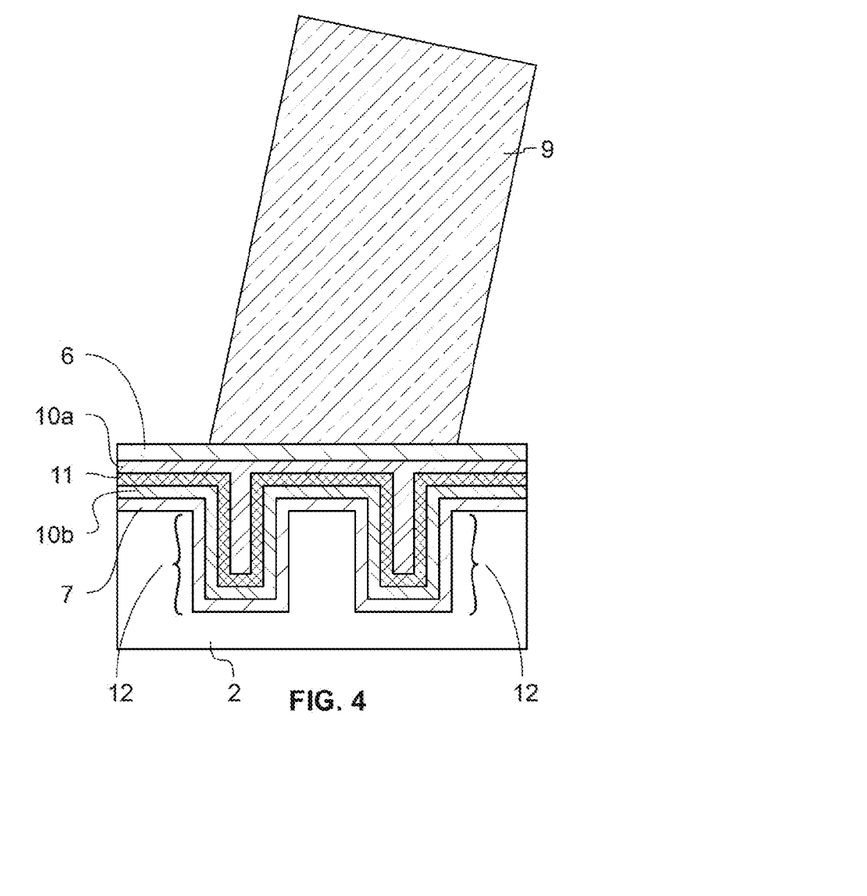
FIG. 4: view of a protection device according to another embodiment arranged on one face of a substrate and subjected to a laser attack.

According to possible variants, the capacitor has a 3D structure. Trenches 12 are formed in the substrate 2. The trenches 12 are produced by conventional etching techniques. The stacking of the capacitor is next deposited in the trenches 12. Each trench 12 receives the second electrode 7, the at least one layer of PCM 8 and the first electrode 6. Preferentially, the at least one layer of PCM 8 fills in the trench and re-establishes a plane on which the first electrode 6 is deposited. Such a structure is illustrated in FIG. 4 with three layers of PCM 10a, 10b, 11. Preferentially, a trench has a width dimension of 500 nm to 1 μm. In this way, a conventional laser beam with a diameter at the point of contact of around 1 to 2 μm will touch at least one trench 12.

This trench structure of the capacitor of the protection device 3 increases the volume of PCM passed through in the amorphous state of the internal layer 11 and of PCM of the external layers 10a, 10b that receives the ion and/or photon beam 9. The heat generated in the PCMs is therefore increased, defining an increased sensitivity for the protection device 3 even for low-power attacks.

Figure 5:
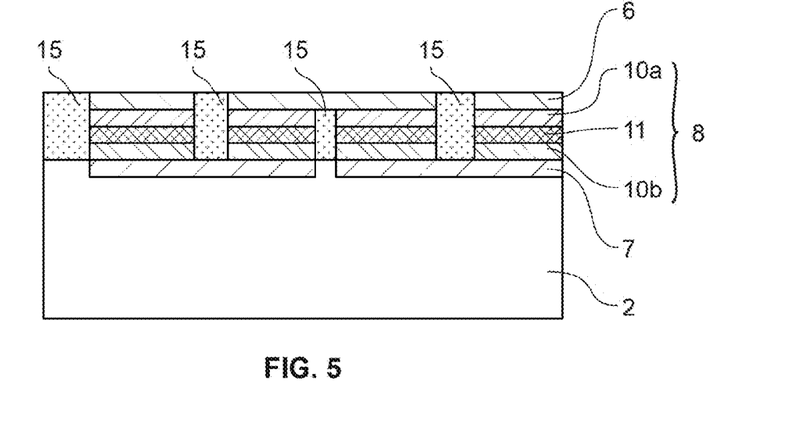
FIG. 5: view of a protection device according to another embodiment arranged on one face of a substrate comprising a plurality of capacitors.

According to another possibility, the protection device 3 comprises a plurality of capacitors in series. To obtain this structure, a plurality of capacitors as described previously are arranged on one face of the substrate 2 and are connected in series. An example of a structure is illustrated in FIG. 5. Islands of insulator 15 are deposited between the capacitors so as to provide a connection in series. In FIG. 5, the capacitors are identical; however, a protection device may be provided with different capacitors. According to this possibility, it is the total capacitance and/or resistance of the protection device 3 that is monitored. The inverse of the total capacitance is calculated by the following formula, where $C_1$ corresponds to the capacitance of the first structure $C_2$, . . . $C_N$ the capacitances of the second or nth structure $$1/C\text{total}=\Sigma_{i=1}^{N}(1/C_i)$$

During an attack by ion and/or photon beam 9, it suffices for an internal layer 11 of PCM to pass to the crystalline state in order to change the total capacitance and/or resistance of the protection device 3 with respect to its initial state. This modification of the total capacitance and/or resistance is detected by the integrated circuit 1.

According to one possibility, the internal layer of PCM 11 of certain capacitors connected in series may be in the crystalline state.

We describe below a method for detecting an attack by photon and/or ion beam 9 on an electronic chip as described above.

Each protection device 3 has a so-called reference capacitance (RCV, standing for reference capacitance value) or RRV (standing for reference resistance value). The example of the RCV will be taken below, but it can be transposed identically for the RRV. This RCV must be maintained throughout the service life of the electronic chip. A change in the capacitance must be detected by the integrated circuit 1 as the signal of an attack.

Preferentially, the integrated circuit 1 itself identifies the RCV, which must be maintained throughout the service life of the electronic chip. This RCV corresponds to the initial capacitance of the protection device 3. It is advantageously measured when the electronic chip is brought into service. According to another embodiment, the RCV is given written in the electronic chip at the time of manufacture thereof. The integrated circuit 1 recovers this data when the electronic chip is brought into service. It is preferred to measure the initial capacitance rather than to have an initial coding since this avoids there being an attack for recovering this RCV data or imposition thereof in order to foil the detection of the attack.

During the life of the electronic chip, the integrated circuit 1 makes subsequent measurements of the capacitance of the protection device 3. The electronic chip makes a comparison of the subsequent value of the capacitance with the initial capacitance RCV. The identification of a difference indicates the existence of an attack by photon and/or ion beam 9. Advantageously, the electronic chip immediately fails so as to prevent the success of the attack and to inform the user of the existence of an attack.

REFERENCES

1. Integrated circuit
2. Substrate

3. Protection device
4. Front face of substrate
5. Rear face of substrate
6. First electrode
7. Second electrode
8. Layer of phase-change material
9. Ion and/or photon beam
10a. External layer of phase-change material
10b. External layer of phase-change material
11. Internal layer of phase-change material
12. Trenches
13. Electrical connection
14. Heating
15. Insulator

The invention claimed is:

1. An electronic chip comprising an integrated circuit arranged on a substrate and a protection device arranged at least partially facing the integrated circuit, wherein the protection device comprises at least one capacitor comprising:
   a first electrode,
   a second electrode,
   and at least three stacked layers of phase-change materials, defiling at least two external layers and at least one internal layer interposed between said at least two external layers,
   wherein at least three stacked layers of phase-change materials are disposed at least partially between the two electrodes, wherein at least a first layer from said at least two external layers and said at least one internal layer is in an amorphous state and is configured so as to at least locally change from said amorphous state in which the capacitor has a first capacitance and/or a first resistance and to a crystalline state in which the capacitor has a second capacitance and/or a second resistance respectively different from the first capacitance and the first resistance, and wherein at least a second layer from said at least two external layers and said at least one internal layer is in a crystalline state, the protection device being electrically connected to the integrated circuit by at least one of said first or second electrodes so that the integrated circuit measures the resistance and/or capacitance of the capacitor.

2. The chip according to claim 1, wherein each of the first and second electrodes covers one of the two external layers respectively and entirely.

3. The chip according to claim 1, wherein the first and second electrodes cover partially and at least respectively an external layer that is associated with it and wherein at least one of the first and second electrodes covers only part of the external layer that is associated with it.

4. The chip according to claim 1, wherein the second resistance of the capacitor is less than the first resistance.

5. The chip according to claim 1, wherein the integrated circuit is arranged on a first face from among a front face or a rear face of the substrate and wherein the protection device is arranged on a second face of the substrate, different from the first face on which the integrated circuit is arranged and chosen from the front face or the rear face of the substrate.

6. The chip according to claim 4, wherein at least one internal layer is said first layer in an amorphous state and wherein at least one of said two external layers is said second layer in a crystalline state.

7. The chip according to claim 1, comprising:
   an internal layer forming said first layer in an amorphous state, and
   two external layers in a crystalline state.

8. The chip according to claim 6, wherein the crystallization temperature of the at least one internal layer of phase-change material is higher than the crystallization temperatures of the external layers of phase-change material.

9. The chip according to claim 6, wherein the external layers of phase-change material have a thickness of between 50 nm and 200 nm and wherein the at least one internal layer of phase-change material has a thickness of preferably between 5 and 30 nm.

10. The chip according to claim 1, wherein the protection circuit is electrically connected to the integrated circuit by a buried interconnection.

11. The chip according to claim 1, wherein the integrated circuit is arranged on one face from among the front face or a rear face of the substrate and wherein the protection device extends over a surface area of the substrate at least equivalent to the surface area over which the integrated circuit extends.

12. The chip according to claim 1, wherein the at least one capacitor comprises at least one trench formed in the thickness of the substrate and wherein the trench has a width of preferably between 500 nm and 1 µm.

13. The chip according to claim 1, wherein the protection device comprises a plurality of capacitors connected in series.

14. A method for manufacturing an electronic chip according to claim 1, comprising at least the following steps of:
   formation of an integrated circuit at a face of a substrate chosen from the front face or the rear face;
   formation of at least one capacitor at least partially facing the integrated circuit, comprising
      the deposition of a first electrode,
      the formation of at least a first external layer made from phase-change material, situated at least partially facing the first electrode,
      the formation of at least one internal layer of phase-change material, configured so as to at least locally change from an amorphous state to a crystalline state by penetration of a photon and/or ion beam, the capacitor having in the amorphous state of the at least one internal layer a first capacitance and/or a first resistance and the capacitor having in the crystalline state of the at least one internal layer a second capacitance and/or a second resistance respectively different from the first capacitance and first resistance,
      the formation of at least a second external layer of phase-change material, at least one of said first and second external layers being in a crystalline state;
      and the deposition of a second electrode at least partially facing the second external layer;
   electrical connection of the protection circuit to the integrated circuit.

15. The manufacturing method according to claim 14, wherein the step of formation of at least one first electrode or the step of formation of at least one second electrode comprises the deposition of a layer of phase-change material in an amorphous state and next comprises a step configured so as to make the phase-change material of said at least one external layer change from the amorphous state to a crystalline state.

* * * * *